US010222440B2

(12) United States Patent
Tomoda et al.

(10) Patent No.: US 10,222,440 B2
(45) Date of Patent: Mar. 5, 2019

(54) SCAN CONDITION DETERMINING APPARATUS AND METHOD FOR A MAGNETIC RESONANCE IMAGING SYSTEM

(71) Applicant: General Electric Company, Schenectady, NY (US)

(72) Inventors: Yoshihiro Tomoda, Hino (JP); Masanori Ozaki, Hino (JP)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 419 days.

(21) Appl. No.: 15/046,226

(22) Filed: Feb. 17, 2016

(65) Prior Publication Data
US 2017/0023657 A1  Jan. 26, 2017

(30) Foreign Application Priority Data

Feb. 17, 2015  (JP) ................................. 2015-028660

(51) Int. Cl.
*G01R 33/54* (2006.01)
*G01R 33/563* (2006.01)
(52) U.S. Cl.
CPC ...... *G01R 33/543* (2013.01); *G01R 33/56341* (2013.01)
(58) Field of Classification Search
CPC .................. G01R 33/543; G01R 33/56341
See application file for complete search history.

(56) References Cited

U.S. PATENT DOCUMENTS

2008/0211496 A1* 9/2008 Tanoue ............ G01R 33/3621
324/307
2013/0251227 A1* 9/2013 Wang ..................... G01R 35/00
382/131

(Continued)

FOREIGN PATENT DOCUMENTS

JP  2013-255854 A  12/2013
JP  2014-008081 A   1/2014
JP  2014-212946 A  11/2014

OTHER PUBLICATIONS

Machine Translation of JP 2014-008081 A obtained on May 17, 2018.*

(Continued)

*Primary Examiner* — Gregory H Curran

(57) ABSTRACT

There is provided a scan condition determining apparatus for a magnetic resonance imaging system comprising accepting means for accepting specification of a desired scan time; and searching means for searching for a second scan condition based on a first scan condition defined before the specification, by adjusting values of parameters affecting a scan time or a signal-to-noise ratio of signals obtained by a scan, said second scan condition being one with which the scan time approximates within an allowable range or matches the desired scan time, and besides, a lowest value of a relative signal-to-noise ratio of the signals approximates within an allowable range or matches a lowest value of the relative signal-to-noise ratio of the signals estimated based on the first scan condition. The parameters include, for example, any one of a number of times of addition, a y-axis direction resolution, a repetition time, and a number of data acquisition passes.

12 Claims, 6 Drawing Sheets

(56) References Cited

U.S. PATENT DOCUMENTS

2015/0157207 A1 6/2015 Ikeda et al.
2016/0202334 A1* 7/2016 Stehning .............. G01R 33/481
　　　　　　　　　　　　　　　　　　　　324/309

OTHER PUBLICATIONS

English Translation of the JP OA for Application No. 2015-028660. Office Action dated Aug. 29, 2017. 3 pages.

* cited by examiner

FIG.3

| Scan Time: | 0:22 | C1 | | | |
|---|---|---|---|---|---|
| Feq.FOV: | 40 | | Feq.Dir: | R/L | |
| Slice Thickness: | 5.0 | | TR: | 5400 | C7 |
| Spacing: | 1.0 | | #Slices: | 23 | |
| # of TE per Scan | 1.0 | | Ferquency : (xres) | 80 | |
| | | | Phase : (yres) | 128 | C6 |
| | | | Acquisition: | 1 | C8 |
| Inv. Time: | 100 | | | | |
| b Value (b1): | 50 | C2 | NEX1: | 1 | C4 |
| b Value (b2): | 500 | C3 | NEX2: | 2 | C5 |

FIG.4

| Scan Time: | 0:16 | C1 |

| Feq.FOV: | 40 | | Feq.Dir: | R/L |
| Slice Thickness: | 5.0 | | TR: | 2715 | C7 |
| Spacing: | 1.0 | | #Slices: | 23 |

| # of TE per Scan | 1.0 | | Ferquency : (xres) | 80 |
| | | | Phase : (yres) | 96 | C6 |
| | | | Acquisition: | 2 | C8 |

| Inv. Time: | 100 |
| | C2 |
| b Value (b1): | 50 | | NEX1: | 1 | C4 |
| b Value (b2): | 500 | | NEX2: | 1 | C5 |
| | C3 |

SCAN CONDITION DETERMINING APPARATUS AND METHOD FOR A MAGNETIC RESONANCE IMAGING SYSTEM

CROSS-REFERENCE TO RELATED APPLICATIONS

This application claims priority to Japanese patent application number 2015-028660, filed on Feb. 17, 2015, the entirety of which is incorporated herein by reference.

BACKGROUND

The present invention relates to a technique of optimizing a scan condition in a magnetic resonance apparatus.

Magnetic resonance imaging sometimes requires breath-holding of a subject as needed for the purpose of improving the signal-to-noise ratio (SNR) of magnetic resonance signals, etc. The breath-holding time is ordinarily adjusted by estimating a duration in which a subject is able to hold his/her breath from his/her age, body size, and/or the like, and taking account of the duration.

In adjusting the breath-holding time, a period of time taken for a scan, i.e., the scan time, must be changed. When the scan time should be changed, conventionally, an operator manually adjusts values of some parameters, such as the number of times of addition (number of excitations) and the repetition time.

Values of the parameters such as the number of times of addition, however, is directly related to the amount of magnetic resonance signals to be collected, which affects the SNR of magnetic resonance signals, and hence, affects image quality of a resulting image. Moreover, to secure an appropriate SNR of magnetic resonance signals, the matrix size, i.e., the resolution of an image, should be changed with the amount of change of the number of times of addition, and such a change operation must be manually performed as well. That is, currently, a situation in which values of parameters are optimized so that an image with good image quality may be obtained within a desired scan time inevitably relies upon operator's experience and/or intuition, so that an inexperienced operator may fail to stably attain good image quality or may unduly take time for adjustment. In particular, in an imaging technique of obtaining a diffusion-weighted image (DWI) that visualizes diffusive motion of water molecules inside a subject, adjustment of parameter values is highly difficult, which results in a significant tendency of the aforesaid problems.

Under such circumstances, there is a need for a technique enabling optimization of a scan condition in a magnetic resonance apparatus, particularly, parameter values for obtaining an image with good image quality within a desired scan time, to be easily and stably achieved without relying upon operator's experience and/or intuition.

SUMMARY

The invention, in its first aspect, provides a scan condition determining apparatus comprising accepting means for accepting specification of a desired scan time; and searching means for searching for a second scan condition based on a first scan condition defined before said specification, by adjusting values of parameters affecting a scan time or a signal-to-noise ratio of signals obtained by a scan, said second scan condition being one with which the scan time approximates within an allowable range or matches said desired scan time, and besides, a lowest value of a relative signal-to-noise ratio (synonymous with SN ratio, S/N, or SNR) of said signals approximates within an allowable range or matches a lowest value of the relative signal-to-noise ratio of said signals estimated based on said first scan condition.

The allowable range for the scan time as used herein may be one second (sec), for example. The allowable range for the signal-to-noise ratio may be 5%, for example. These allowable ranges may be arbitrarily set and are not limited to these examples.

The invention, in its second aspect, provides the scan condition determining apparatus described regarding the first aspect, wherein said parameters include at least one of a number of times of addition, a y-axis direction resolution, a repetition time, and a number of data acquisition passes (data acquisition pass time, or acquisitions).

The invention, in its third aspect, provides the scan condition determining apparatus described regarding the second aspect, wherein: said searching means comprises first estimating means for estimating, based on said first scan condition, a lowest value of the relative signal-to-noise ratio of signals obtained when performing a scan with said first scan condition; second estimating means for estimating, based on a temporary scan condition, a scan time when performing a scan with said scan condition, said temporary scan condition being said first scan condition in its initial state and updated thereafter; third estimating means for estimating, based on said temporary scan condition, a lowest value of the relative signal-to-noise ratio of signals obtained when performing a scan with said scan condition; and repeating means for repeating adjustment on the number of times of addition, y-axis direction resolution, repetition time, and number of data acquisition passes included in said temporary scan condition until a difference between the scan time according to said temporary scan condition and said desired scan time falls within an allowable range, and a difference between the lowest value of the relative signal-to-noise ratio according to said temporary scan condition and the lowest value of the relative signal-to-noise ratio according to said first scan condition falls within an allowable range.

The invention, in its fourth aspect, provides the scan condition determining apparatus described regarding the third aspect, wherein said first scan condition is a scan condition for obtaining a diffusion-weighted image.

The invention, in its fifth aspect, provides the scan condition determining apparatus described regarding the fourth aspect, wherein said third estimating means determines a value of the relative signal-to-noise ratio using the following equation:

$$\text{RELATIVE SIGNAL-TO-NOISE RATIO} = e^{-bD}\sqrt{\frac{NEX}{yres}}$$

In the equation, e designates an exponential function, b designates a b-value, D designates a diffusion coefficient, NEX designates a number of times of addition, and yres designates a y-axis direction resolution.

The invention, in its sixth aspect, provides the scan condition determining apparatus described regarding the fourth or fifth aspect, wherein said temporary scan condition is for performing a plurality of scans having corresponding b-values different from one another, said second estimating means estimates a sum of the scan time for each of said plurality of scans as the scan time according to said temporary scan condition, and said third estimating means determines a value of the relative signal-to-noise ratio for each of said plurality of scans, and estimates a lowest one of said determined values of the relative signal-to-noise ratio as a lowest value of the relative signal-to-noise ratio according to said temporary scan condition.

The invention, in its seventh aspect, provides the scan condition determining apparatus described regarding the sixth aspect, wherein said repeating means repeats the processing involving: in the case that said desired scan time is smaller than the scan time according to said first scan condition, decrementing the number of times of addition in a scan corresponding to a b-value resulting in a highest value of the relative signal-to-noise ratio, adjusting said y-axis direction resolution so that the lowest value of the relative signal-to-noise ratio estimated by said third estimating means comes close to that according to said first scan condition, and adjusting the repetition time and number of data acquisition passes so that the scan time is reduced.

The invention, in its eighth aspect, provides the scan condition determining apparatus described regarding the sixth or seventh aspect, wherein said repeating means repeats the processing involving: in the case that said desired scan time is greater than the scan time according to said first scan condition, incrementing the number of times of addition in a scan condition corresponding to a b-value resulting in a lowest value of the relative signal-to-noise ratio, adjusting said y-axis direction resolution so that the lowest value of the relative signal-to-noise ratio estimated by said third estimating means comes close to that according to said first scan condition, and adjusting the repetition time and number of data acquisition passes so that the scan time is reduced.

The invention, in its ninth aspect, provides the scan condition determining apparatus described regarding any one of the first through eighth aspects, wherein said first scan condition is a scan condition stored beforehand.

The invention, in its tenth aspect, provides a magnetic resonance apparatus comprising the scan condition determining apparatus described regarding any one of the first through fifth aspects.

The invention, in its eleventh aspect, provides a scan condition determining method comprising an accepting step of accepting specification of a desired scan time; and a searching step of searching for a second scan condition based on a first scan condition defined before said specification, by adjusting values of parameters affecting a scan time or a signal-to-noise ratio of signals obtained by a scan, said second scan condition being one with which the scan time approximates within an allowable range or matches said desired scan time, and besides, a lowest value of a relative signal-to-noise ratio of signals obtained by a scan approximates within an allowable range or matches a lowest value of the relative signal-to-noise ratio of said signals estimated based on said first scan condition.

The invention, in its twelfth aspect, provides a program causing a computer to execute accepting processing of accepting specification of a desired scan time; and searching processing of searching for a second scan condition based on a first scan condition defined before said specification, by adjusting values of parameters affecting a scan time or a signal-to-noise ratio of signals obtained by a scan, said second scan condition being one with which the scan time approximates within an allowable range or matches said desired scan time, and besides, a lowest value of a relative signal-to-noise ratio of signals obtained by a scan approximates within an allowable range or matches a lowest value of the relative signal-to-noise ratio of said signals estimated based on said first scan condition.

According to the invention described in the above aspects, a scan condition with which the scan time is a desired scan time, and besides, the signal-to-noise ratio of signals obtained by a scan is secured to be at a level equivalent to that of the scan condition defined beforehand is automatically searched for, and therefore, the operator may cut down on the operation of manually optimizing such a scan condition, which achieves easy and stable optimization of a scan condition.

BRIEF DESCRIPTION OF THE DRAWINGS

FIG. 3 is a diagram showing an exemplary scan condition determining screen.

FIG. 4 is a diagram showing an exemplary scan condition determining screen after inputting a desired scan time.

DETAILED DESCRIPTION

Figure 1:
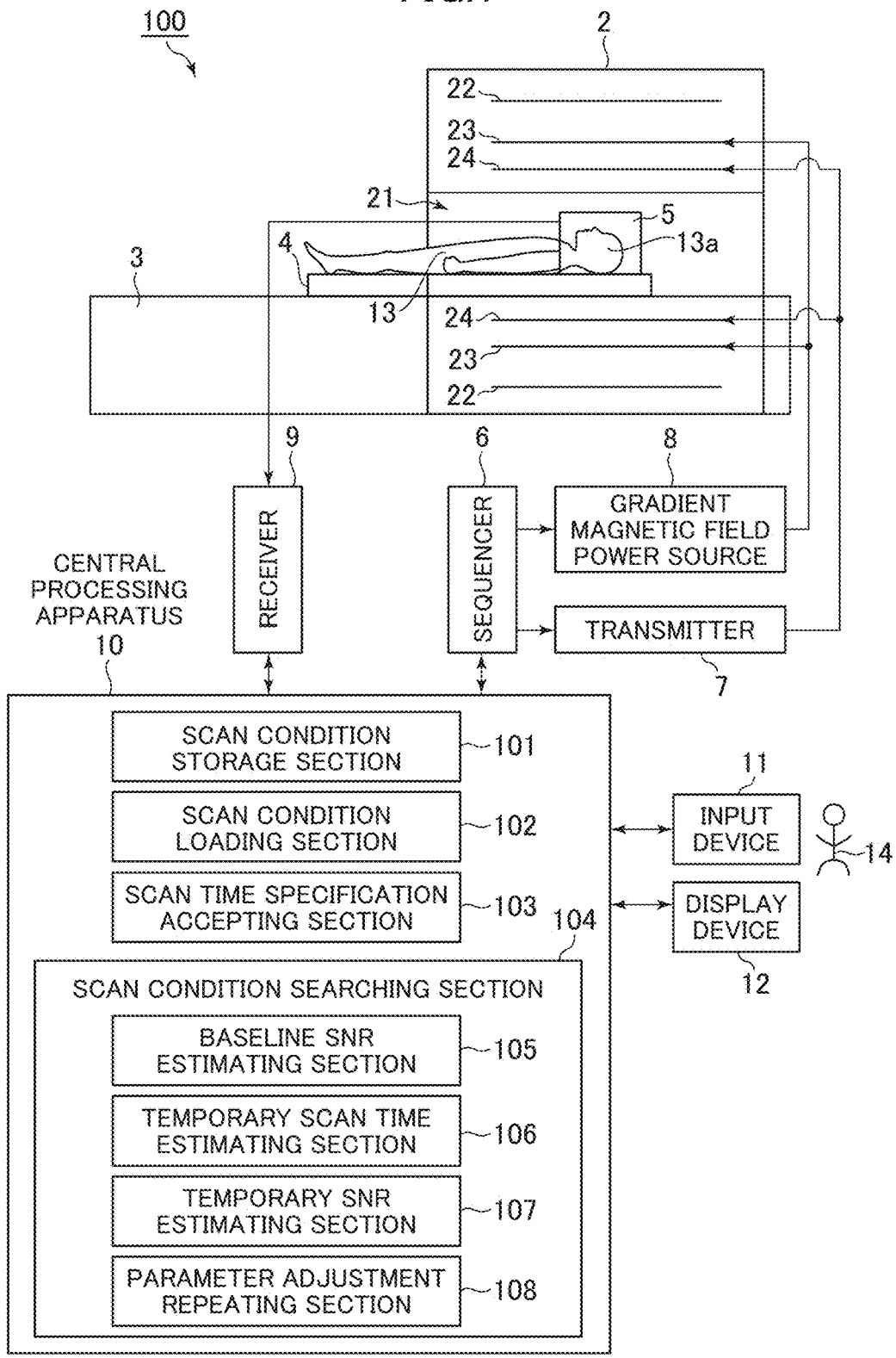
FIG. 1 is a schematic diagram of a magnetic resonance imaging apparatus, which is one embodiment of the invention.

FIG. 1 is a schematic diagram of a magnetic resonance imaging apparatus, which is one embodiment of the invention.

A magnetic resonance imaging (MRI) apparatus 100 comprises a magnetic field generating apparatus 2, a table 3, a cradle 4, and a receive (receiving) coil 5.

The magnetic field generating apparatus 2 has a bore 21 in which a subject 13 is received, a super-conductive coil 22, a gradient coil 23, and a transmit coil 24. The super-conductive coil 22 applies a static magnetic field B0, and the gradient coil 23 applies gradient magnetic fields in a frequency-encoding direction, a phase-encoding direction, and a slice-selective direction. The transmit coil 24 transmits an RF pulse. It should be noted that a permanent magnet may be employed in place of the super-conductive coil 22. The frequency encoding direction is sometimes referred to as x-axis direction, and the phase encoding direction as y-axis direction.

The cradle 4 is configured to be movable from the table 3 into the bore 21. By the cradle 4, the subject 13 is carried into the bore 21.

The receive coil 5 is attached to a region to be imaged 13a in the subject 13. The receive coil 5 receives magnetic resonance signals from the region to be imaged 13a. The region to be imaged 13a may be the head, chest, or abdomen, for example.

The MRI apparatus 100 further has a sequencer 6, a transmitter 7, a gradient magnetic field power source 8, a receiver 9, a central processing apparatus 10, an input device 11, and a display device 12.

The sequencer 6 transmits information for performing a scan to the transmitter 7 and to the gradient magnetic field power source 8 in response to control of the central processing apparatus 10. In particular, the sequencer 6 sends information on RF pulses (the central frequency, bandwidth, etc.) to the transmitter 7, and information on the gradient magnetic field (the intensity of the gradient magnetic field, etc.) to the gradient magnetic field power source 8 in response to control of the central processing apparatus 10.

The transmitter 7 outputs a driving signal for driving the transmit coil 24 based on the information sent from the sequencer 6.

The gradient magnetic field power source 8 outputs a driving signal for driving the gradient coil 23 based on the information sent from the sequencer 6.

The receiver 9 applies signal processing to the magnetic resonance signals received at the receive coil 5, and transmits the resulting signals to the central processing apparatus 10.

The central processing apparatus 10 controls operation of several sections in the MRI apparatus 100 to implement several kinds of operation of the MRI apparatus 100, such as an operation of transmitting required information to the sequencer 6 and to the display device 12, and an operation of reconstructing images based on the signals received from the receiver 9.

The central processing apparatus 10 comprises a scan condition storage section 101, a scan condition loading section 102, a scan time specification accepting section 103, and a scan condition searching section 104.

The scan condition storage section 101 stores therein one or more scan conditions. The scan condition storage section 101 in the present embodiment stores therein at least a scan condition optimized to some degree for obtaining a diffusion-weighted image. The scan condition for obtaining a diffusion-weighted image is that prepared by, for example, a provider of the MRI apparatus or a user making some modifications based on the prepared conditions. The scan condition may be sometimes referred to as protocol.

The scan condition loading section 102 loads the scan condition stored in the scan condition storage section 101 and sets it. The set scan condition is designated here as first scan condition R1. In the present embodiment, a scan condition optimized to some degree for obtaining a diffusion-weighted image is loaded. The loading of a scan condition may be triggered by an operation by the operator 14, or they may be automatically loaded in displaying a scan condition determining screen.

The scan time specification accepting section 103 accepts specification of a desired scan time $ST_d$ by the operator 14.

The scan condition searching section 104 searches for a scan condition optimized so that the scan time is the specified desired scan time $ST_d$ and a diffusion-weighted image may be obtained with good image quality. More particularly, based on the first scan condition R1 defined before specification of the desired scan time $ST_d$, values of a number of times of addition NEX, a y-axis direction resolution yres, a repetition time TR, and a number of data acquisition passes Acq are adjusted to thereby search for a second scan condition with which the scan time approximates within an allowable range or matches the desired scan time $ST_d$, and besides, a lowest value of the SNR of magnetic resonance signals obtained by a scan approximates within an allowable range or matches a lowest value of the relative SNR of magnetic resonance signals estimated based on the first scan condition R1.

The scan condition searching section 104 has a baseline SNR estimating section 105, a temporary scan time estimating section 106, a temporary SNR estimating section 107, and a parameter adjustment repeating section 108.

The baseline SNR estimating section 105 estimates a worst value (lowest value) $SNR_{min1}$ of the relative SNR of magnetic resonance signals obtained when a scan is performed with the original first scan condition R1 before optimizing the scan condition, and stores a resulting value as baseline of the relative SNR of magnetic resonance signals.

The temporary scan time estimating section 106 estimates, based on a temporary scan condition $R_{temp}$, a scan time taken when a scan is performed with the scan condition, as temporary scan time $ST_{temp}$. The temporary scan condition $R_{temp}$ is a scan condition that is the original first scan condition R1 before optimizing the scan time in its initial state, and thereafter is updated when searching for an optimized second scan condition R2.

The temporary SNR estimating section 107 calculates, based on the temporary scan condition $R_{temp}$, a relative SNR of magnetic resonance signals obtained when a scan is performed with the scan condition for each b-value.

The parameter adjustment repeating section 108 repetitively makes adjustment on values of specific parameters in the temporary scan condition $R_{temp}$ while keeping the relative SNR of magnetic resonance signals at a level approximately equal to $SNR_{min1}$ serving as the baseline described above, until the temporary scan time $ST_{temp}$ comes sufficiently close to the desired scan time $ST_d$. More particularly, adjustment of the number of times of addition NEX, y-axis direction resolution yres, repetition time TR, and number of data acquisition passes Acq included in the temporary scan condition $R_{temp}$ is repetitively made until a difference between the temporary scan time $ST_{temp}$ according to the temporary scan condition $R_{temp}$ and the desired scan time $ST_d$ falls within an allowable range, and besides, a difference between a lowest value $SNR_{temp}$ of the relative SNR of magnetic resonance signals according to the temporary scan condition $R_{temp}$ and the lowest value $SNR_{min1}$ of the relative SNR according to the original first scan condition R1, which is in the initial state, falls within an allowable range.

The central processing apparatus 10 is constructed by, for example, a computer, and it functions as these sections by executing predefined programs. It should be noted that the scan time specification accepting section 103, scan condition searching section 104, baseline SNR estimating section 105, temporary scan time estimating section 106, temporary SNR estimating section 107, and parameter adjustment repeating section 108 represent examples of the specification accepting means, searching means, first estimating means, second estimating means, third estimating means, and repeating means, respectively.

The input device 11 inputs several kinds of instructions to the central processing apparatus 10 in response to an operation by the operator 14. The display device 12 displays several kinds of information.

Figure 2:
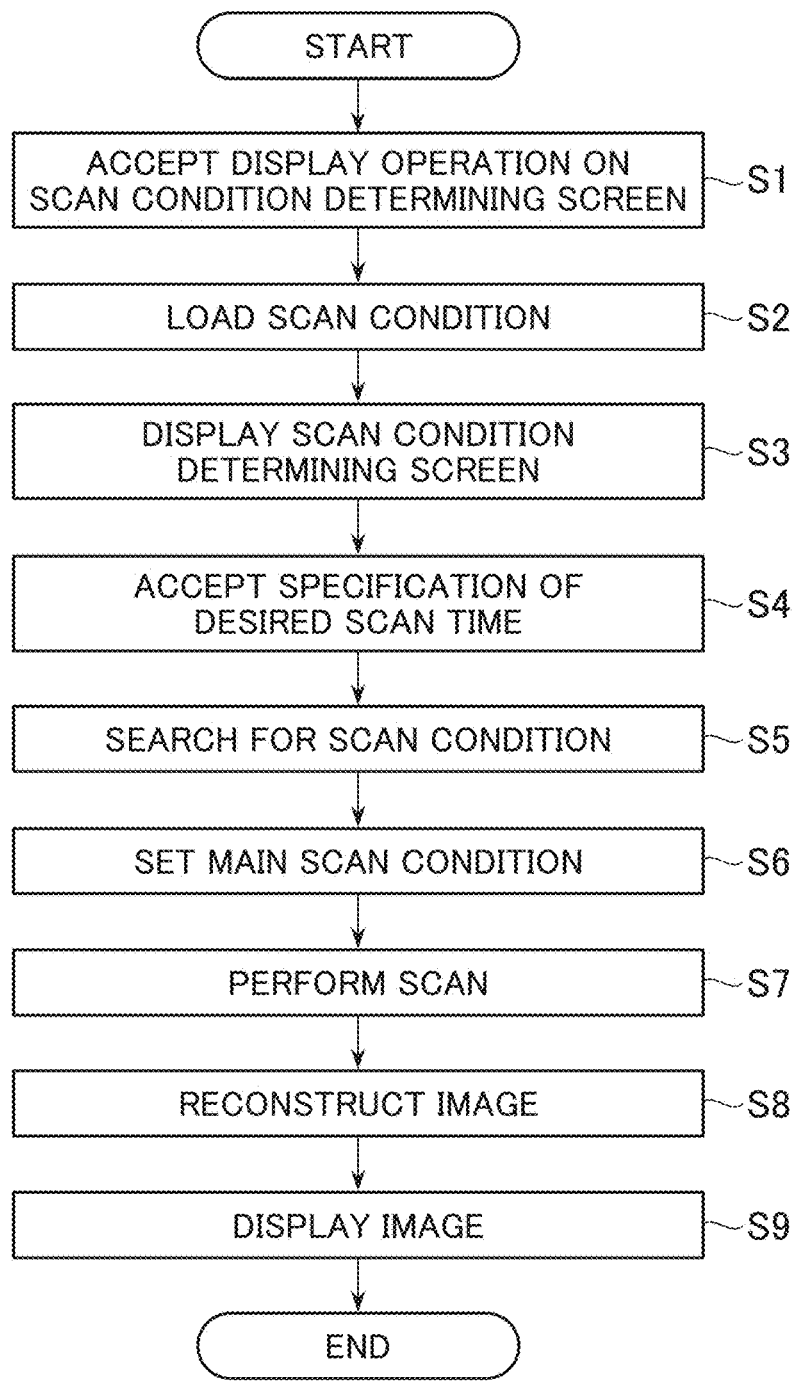
FIG. 2 is a diagram showing the flow of processing by the MRI apparatus in performing a scan.

FIG. 2 is a diagram showing the flow of processing by the MRI apparatus 100 in performing a scan.

At Step S1, a display operation on a scan condition determining screen is accepted. In particular, the operator 14 first makes an operation of displaying on the display device 12 a screen (scan condition determining screen) for determining a scan condition directed to diffusion-weighted image acquisition. The input device 11 accepts the operation and sends operational information to the central processing apparatus 10.

At Step S2, a scan condition is loaded. In particular, the scan condition loading section 102 loads, prior to display of the scan condition determining screen, a scan condition stored beforehand in the scan condition storage section 101, and sets it. The first scan condition R1 loaded and set here is that prepared for acquiring a diffusion-weighted image, and have values of parameters optimized to some degree. For example, the values of parameters are appropriately balanced among several factors, such as the SNR of magnetic resonance signals collected in a scan, scan time taken for the scan, and resolution of the image.

At Step S3, the scan condition determining screen is displayed. In particular, the central processing apparatus 10 displays the scan condition determining screen on the display device 12. On the scan condition determining screen, values of a large number of parameters constituting the first scan condition R1 set at Step S2 are displayed.

FIG. 3 is a diagram showing an exemplary scan condition determining screen.

The example in FIG. 3 shows input or display fields for a large number of parameters constituting the first scan condition R1. The input or display fields for the large number of parameters each display a value of a parameter constituting the first scan condition R1 or a value calculated therefrom as initial values.

The large number of parameters include, for example, the cross section for imaging (Scan Plane), FOV in the frequency-encoding direction (Freq. FOV), Slice Thickness, inter-slice spacing (Spacing), frequency-encoding direction (Freq. Dir), repetition time (TR), number of slices (#Slices), echo time (TE), number of echo times that can be defined for one scan (# of TE(s) per Scan), echo train length, inversion time (Inv. Time), number of matrices in the frequency-encoding direction (Frequency) or x-axis direction resolution (xres), number of matrices in the phase-encoding direction (Phase) or y-axis direction resolution (yres), number of times of addition (number of excitations; NEX), bandwidth (Band Width), and number of data acquisition passes (Acquisition).

The large number of parameters also include a parameter called b-value. The b-value is an important parameter in the scan condition for obtaining a diffusion-weighted image, and designates the intensity at which MPG (Motion Probing Gradient) is applied (its unit is s/mm$^2$). A greater b-value gives an image with more enhanced diffusion. Imaging with two or more different b-values excludes an effect of T2 and gives an apparent diffusion coefficient (ADC). In the present embodiment, it is assumed that two diffusion-weighted images are obtained with mutually different b-values. Moreover, it is assumed that the number of times of addition NEX is individually defined for each b-value, and values of the other parameters are used in common. Therefore, the scan condition dealt with in the present embodiment is for performing a scan with a first b-value $b_1$ and a first number of times of addition $NEX_1$ for obtaining a first diffusion-weighted image and a scan with a second b-value $b_2$ and a second number of times of addition $NEX_2$ for obtaining a second diffusion-weighted image.

For values of the parameters constituting the first scan condition R1, the first b-value $b_1$ and second b-value $b_2$ are 50 and 500, for example. The first number of times of addition $NEX_1$ and second number of times of addition $NEX_2$ are 1 and 2, for example. The y-axis direction resolution yres is 128, for example, and the number of data acquisition passes Acq is 1, for example.

Now let us focus on some parameters, which are the scan time, b-value, number of times of addition, y-axis direction resolution, repetition time, and number of data acquisition passes.

The scan condition determining screen displays input fields C1 to C3 for inputting values of the scan time ST, first b-value $b_1$, and second b-value $b_2$, respectively. The scan condition determining screen also displays display fields C4 to C8 for displaying values of the first number of times of addition $NEX_1$, second number of times of addition $NEX_2$, y-axis direction resolution yres, repetition time TR, and number of data acquisition passes Acq, respectively.

The scan time ST, first b-value $b_1$, and second b-value $b_2$ may be directly input/set using their input fields C1 to C3. Values of the first number of times of addition $NEX_1$, second number of times of addition $NEX_2$, y-axis direction resolution yres, repetition time TR, and number of data acquisition passes Acq are not allowed to be directly input/set by the operator 14.

At Step S4, specification of a desired scan time $ST_d$ is accepted. In particular, the operator 14 inputs and specifies a desired scan time $ST_d$ to the input fields C1 for the scan time ST. The scan time specification accepting section 103 accepts the specification and defines the specified desired scan time $ST_d$ as target scan time.

FIG. 4 is a diagram showing an exemplary scan condition determining screen after inputting the desired scan time. In this example, "0:16" (0 minutes and 16 seconds) is input to the input fields C1 for the scan time as desired scan time $ST_d$.

At Step S5, a scan condition is searched for. In particular, the scan condition searching section 104 searches for a second scan condition R2 optimized so that the scan time is the desired scan time $ST_d$ and a diffusion-weighted image may be obtained with good image quality. The scan condition search processing will be discussed in more detail later.

At Step S6, a main scan condition is set. The central processing apparatus 10 sets the searched second scan condition R2 as the main scan condition.

At Step S7, a scan is performed. Particularly, the central processing apparatus 10 controls several sections based on the main scan condition to thereby perform a scan.

At Step S8, an image is reconstructed. In particular, the central processing apparatus 10 produces a first diffusion-weighted image by the first b-value $b_1$ and a second diffusion-weighted image by the second b-value $b_2$ based on data of magnetic resonance signals obtained by the scan. The central processing apparatus 10 also produces an ADC (Apparent Diffusion Coefficient) map that visualizes the diffusion coefficient at each position based on the two diffusion-weighted images.

At Step S9, the images are displayed. In particular, the central processing apparatus 10 controls the display device 12 to display the produced images on the screen.

Now the aforementioned scan condition search processing will be described in detail. According to the scan condition search processing, a second scan condition R2 is searched for, with which the scan time ST is the desired scan time $ST_d$ specified by the operator 14, and besides, the relative SNR of magnetic resonance signals is secured to be at a level approximately equal to the lowest value $SNR_{min1}$ of the relative SNR of magnetic resonance signals according to the first scan condition R1 set before the desired scan time $ST_d$ is specified.

In particular, the scan condition searching section 105 adjusts values of the number of times of addition NEX, y-axis direction resolution yres, repetition time TR, and number of data acquisition passes Acq based on the first scan condition R1 to thereby search for a second scan condition R2 with which the scan time ST matches the desired scan time $ST_d$ within an allowable range, and besides, a lowest value of the relative SNR of magnetic resonance signals matches the lowest value $SNR_{min1}$ estimated according to the first scan condition R1 within an allowable range.

Now the flow of the scan condition search processing will be described below.

Figure 5:
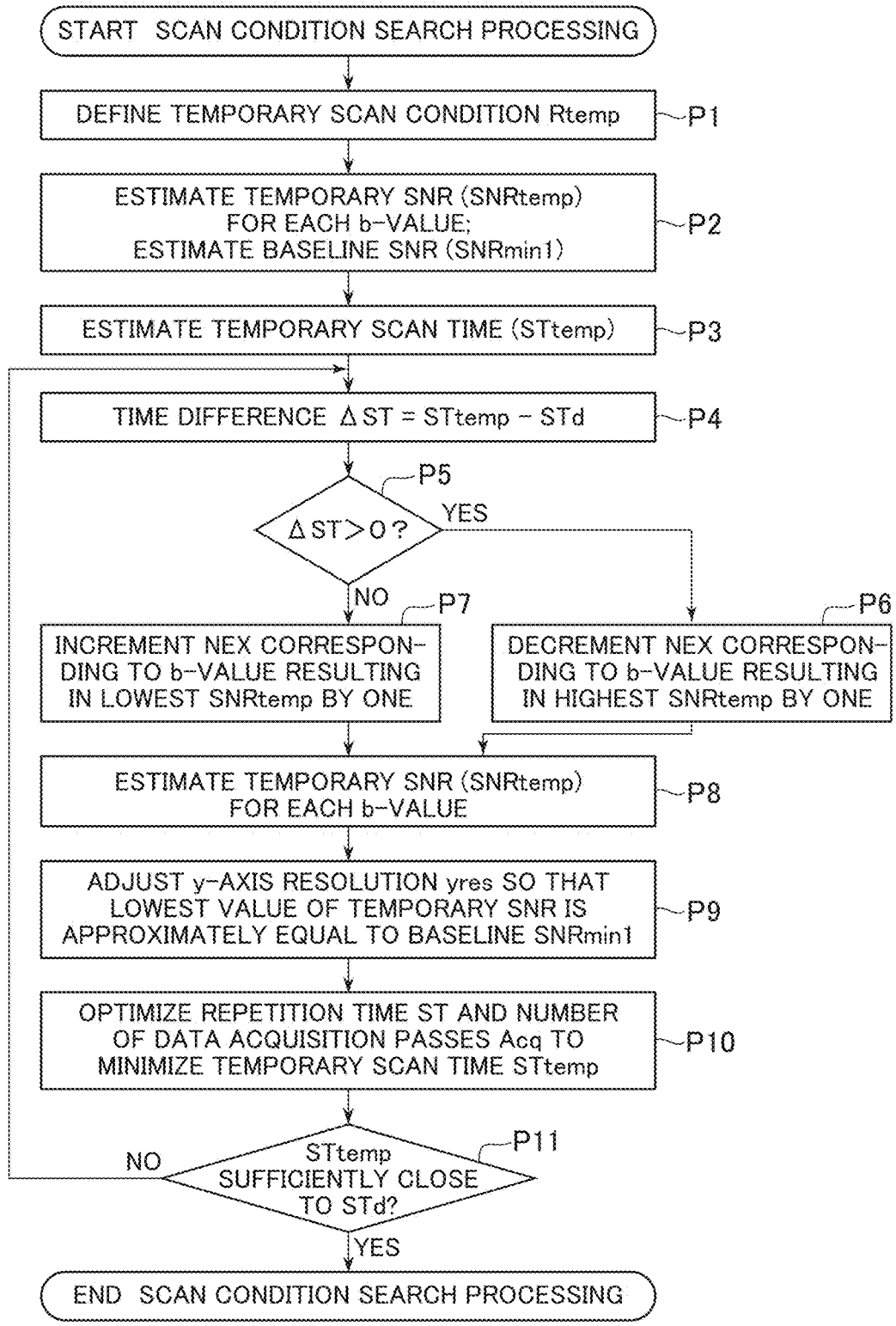
FIG. 5 is a diagram showing the flow of scan condition search processing.

FIG. 5 is a diagram showing the flow of the scan condition search processing.

At Step P1, a temporary scan condition is defined. In particular, the scan condition searching section 104 defines a temporary scan condition $R_{temp}$, which is the first scan condition R1 in its initial state and will be updated later.

At Step P2, a temporary SNR and a baseline SNR are estimated. In particular, the baseline SNR estimating section 105 estimates, based on the temporary scan condition $R_{temp}$, a worst value (lowest value) of the relative SNR of magnetic resonance signals obtained when a scan is performed with this scan condition. At that time, the temporary scan condition $R_{temp}$ is in its initial state and is precisely the same as the first scan condition R1. That is, the worst value (lowest value) of the relative SNR of magnetic resonance signals estimated here is a worst value of the relative SNR according to the first scan condition R1. The value is stored here as baseline $SNR_{min1}$.

Generally, the value of the relative SNR of magnetic resonance signals may be determined using, for example, the following equation:

$$\text{RELATIVE } SNR = e^{-bD}\sqrt{\frac{NEX}{yres}} \quad (1)$$

where e designates an exponential function, b designates a b-value, D designates a diffusion coefficient, NEX designates a number of times of addition, and yres designates a y-axis direction resolution. The diffusion coefficient D is assumed as a typical value, for example, 0.001.

In the present embodiment, the temporary scan condition $R_{temp}$ is for performing a scan with the first b-value $b_1$ and a scan with the second b-value $b_2$. Moreover, since the number of times of addition NEX is prepared for each b-value, the temporary scan condition $R_{temp}$ includes a first number of times of addition $NEX_{1\_temp}$ for the scan with the first b-value $b_1$ and a second number of times of addition $NEX_{2\_temp}$ for the scan with the second b-value $b_2$. Thus, a relative SNR ($SNR_{1temp}$) of magnetic resonance signals by a scan corresponding to the first b-value $b_1$ in the temporary scan condition $R_{temp}$ and a relative SNR ($SNR_{2temp}$) of magnetic resonance signals by a scan corresponding to the second b-value $b_2$ in the first scan condition R1 are determined here using the following equations:

$$SNR_{1temp} = e^{-b_1 D}\sqrt{\frac{NEX_{1temp}}{yres}} \quad (2)$$

and $$SNR_{2temp} = e^{-b_2 D}\sqrt{\frac{NEX_{2temp}}{yres}} \quad (3)$$

Then, a worst value (lowest value) $SNR_{min\_temp}$ of the relative SNR of magnetic resonance signals according to the temporary scan condition $R_{temp}$ is determined using the following equation:

$$SNR_{min\_temp} = \min\{SNR_{1temp}, SNR_{2temp}\}, \quad (4)$$

wherein min refers to a function taking a minimum value.

As described earlier, the temporary scan condition $R_{temp}$ is in its initial state at that time and is precisely the same as the initially set first scan condition R1. Thus, $SNR_{min\_temp}$ determined here is stored as worst value (lowest value) $SNR_{min1}$ of the relative SNR of magnetic resonance signals according to the first scan condition R1.

At Step P3, a temporary scan time is estimated. In particular, the temporary scan time estimating section 106 estimates a temporary scan time $ST_{temp}$ based on the temporary scan condition $R_{temp}$. The temporary scan time $ST_{temp}$ is a sum of a scan time $ST_{temp\_b1}$ by the scan corresponding to the first b-value $b_1$ and a scan time $ST_{temp\_2}$ by the scan corresponding to the second b-value $b_2$.

At Step P4, the desired scan time $ST_d$, which is the target, is subtracted from the temporary scan time $ST_{temp}$ to determine a time difference $\Delta ST$, which is equivalent to the difference between them:

$$\Delta ST = ST_{temp} - ST_d. \quad (5)$$

At Step P5, a decision is made as to whether a condition that the time difference $\Delta ST > 0$ is satisfied. When satisfied, a decision is made that adjustment of the parameter values is required such that the scan time ST is reduced more, and the flow goes to Step P6. When not satisfied, a decision is made that adjustment of the parameter values is required such that the scan time ST is increased more, and the flow goes to Step P7.

At Step P6, adjustment for reducing the scan time ST is made. In particular, the number of times of addition NEX in a scan that gives a highest estimated relative SNR in the temporary scan condition $R_{temp}$ is decremented by one. In other words, the number of times of addition NEX corresponding to a b-value resulting in a highest estimated relative SNR is decremented by one. This means that adjustment is made in the temporary scan condition $R_{temp}$ such that the number of times of addition NEX is reduced for a scan that gives the most surplus SNR of magnetic resonance signals, whereby the scan time ST is reduced at the cost of reducing the SNR. After finishing the processing, the flow goes to Step P8.

At Step P7, adjustment for increasing the scan time ST is made. In particular, the number of times of addition NEX in a scan that gives a lowest estimated relative SNR in the temporary scan condition $R_{temp}$ is incremented by one. In other words, the number of times of addition NEX corresponding to a b-value resulting in a lowest estimated relative SNR is incremented by one. This means that adjustment is made in the temporary scan condition $R_{temp}$ such that the number of times of addition NEX is increased for a scan that gives the least surplus SNR of magnetic resonance signals, whereby the scan time ST is increased at the cost of bringing up the SNR. After finishing the processing, the flow goes to Step P8.

At Step P8, the temporary SNR estimating section 107 calculates a relative SNR of magnetic resonance signals for each b-value based on the temporary scan condition $R_{temp}$:

$$SNR_{1temp} = e^{-b_1 D}\sqrt{\frac{NEX_{temp}}{yres}} \quad (6)$$

and $$SNR_{2temp} = e^{-b_2 D}\sqrt{\frac{NEX_{2temp}}{yres}} \quad (7)$$

Then, a worst value (lowest value) $SNR_{min\_temp}$ of the relative SNR of magnetic resonance signals according to the temporary scan condition $R_{temp}$ is determined.

$$SNR_{min\_temp} = \min\{SNR_{1temp}, SNR_{2temp}\}, \quad (8)$$

At Step P9, the y-axis direction resolution yres is adjusted so that the worst value of the relative SNR calculated at Step P8 for each b-value approximates within a certain allowable range or matches the worst value of the relative SNR according to the first scan condition R1 in its initial state, i.e., baseline $SNR_{min1}$. The allowable range here may be 5% of the baseline $SNR_{min1}$, for example. It should be noted that the resolution xres in the x-axis direction (number Freq of matrices in the frequency-encoding direction) is not changed here because it affects distortion of an image.

At Step P10, processing of optimizing the repetition time TR and number of data acquisition passes Acq is performed so that the temporary scan time $ST_{temp}$ is minimized.

At Step P11, a decision is made as to whether the temporary scan time $ST_{temp}$ is sufficiently close to the target desired scan time $ST_d$. In the decision, for example, whether the temporary scan time $ST_{temp}$ approximates within a certain allowable range or matches the desired scan time $ST_d$ is decided. That is, the decision is achieved by thresholding of the difference between the scan times, or the like. The allowable range here may be one second (sec), for example. In the decision, in the case that the temporary scan time $ST_{temp}$ is decided to be sufficiently close to the desired scan time $ST_d$, the processing is terminated. In the case that it is decided not to be sufficiently close, the flow goes back to Step P4 and the processing is continued.

Values of the parameters constituting the thus-searched second scan condition R2 are those as shown in the scan condition determining screen in FIG. 4, for example. Specifically, for values of the parameters constituting the second scan condition R2, the first b-value $b_1$ and second b-value $b_2$ remain at 50 and 500, for example. The first number of times of addition $NEX_1$ and second number of times of addition $NEX_2$ are 1 and 1, for example. The y-axis direction resolution yres is 96, for example, and the number of data acquisition passes Acq is 2, for example. As compared with the exemplary first scan condition R1 shown in FIG. 3, the second number of times of addition $NEX_2$ is decreased from 2 to 1. The y-axis direction resolution yres is decreased from 128 to 96. The number of data acquisition passes Acq is increased from 1 to 2.

Figure 6:
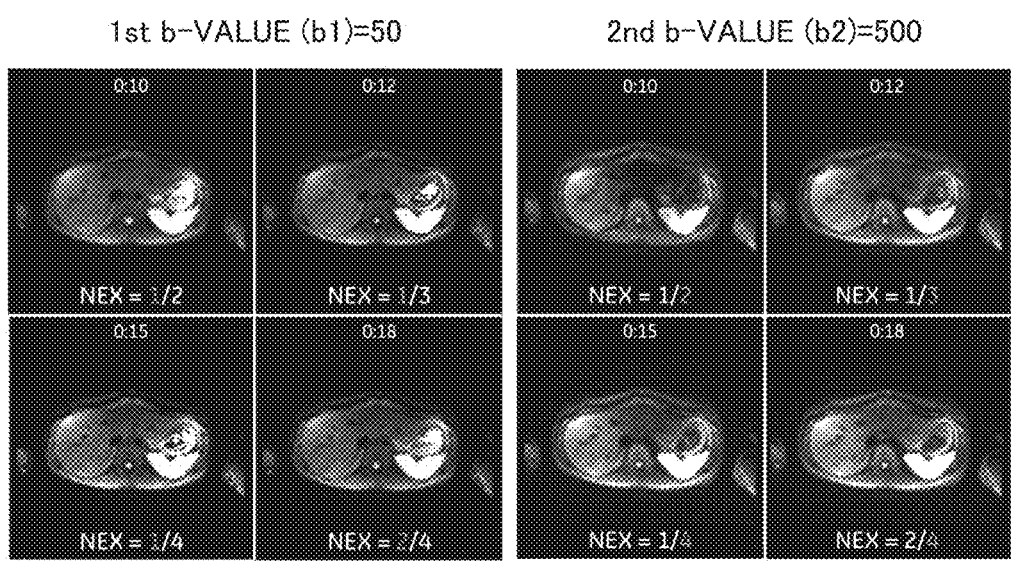
FIG. 6 is a diagram showing exemplary diffusion-weighted images obtained by the method proposed herein.

FIG. 6 is a diagram showing exemplary diffusion-weighted images obtained by the method proposed herein. These examples are cross-sectional images of the same slice in the abdomen of a subject. The first b-value $b_1$=50 and the second b-value $b_2$=500, with each of which imaging is performed during one-time breath-holding. The left side shows a group of images with the first b-value $b_1$=50, while the right side shows a group of images with the second b-value $b_2$=500. The upper portion of each image shows the scan time (minute: second). The lower portion of each image shows the number of times of addition $NEX_1$ for the first b-value $b_1$=50, and the number of times of addition $NEX_2$ for the second b-value $b_2$=500. These images prove that the method proposed herein, in which the number of times of addition NEX, y-axis direction resolution yres, repetition time TR, and number of data acquisition passes Acq are optimized by merely changing the scan time ST to a desired scan time, stably provides an image with good image quality having an appropriately secured SNR of magnetic resonance signals.

According to the present embodiment described above, a scan condition with which the scan time matches a specified desired scan time within an allowable range and the SNR of magnetic resonance signals matches the SNR according to an original scan condition within an allowable range may be automatically found and determined, so that the operator is able to easily and stably set a scan condition that provides an image with good image quality within a desired scan time without relying upon his/her experience and/or intuition. Consequently, stress on the operator is mitigated, and in addition, the time taken to set a scan condition and occasions of re-scans due to image quality lowering of images may be reduced, which improves workflow.

The embodiment of the invention is not limited to that described above and several modifications may be made within the scope of the invention without departing from the spirit thereof.

For example, while the embodiment above addresses a case in which imaging is performed with two mutually different b-values, imaging may be performed with three or more mutually different b-values.

Moreover, for example, while the embodiment above addresses a case in which a diffusion-weighted image is obtained, the invention may be applied to a case in which other images are obtained.

Furthermore, while the embodiment above refers to a magnetic resonance imaging apparatus, a scan condition determining method and a scan condition determining apparatus that determine a scan condition by a similar method to that in the present apparatus each constitute one embodiment of the present invention. In addition, a program for causing a computer to execute processing according to such a scan condition determining method, and a computer-readable recording medium on which such a program is recorded also each constitute one embodiment of the present invention.

What is claimed is:

1. A scan condition determining apparatus comprising:
   accepting means for accepting specification of a desired scan time;
   a scan condition storage section storing a pre-defined first scan condition;
   first estimating means for estimating, based on the first scan condition, a lowest value of relative signal-to-noise ratio of signals obtained when performing a scan with the first scan condition;
   second estimating means for estimating, based on a temporary scan condition, a scan time when performing a scan with the temporary scan condition, the temporary scan condition being the first scan condition in its initial state and updated thereafter;
   third estimating means for estimating, based on the temporary scan condition, a lowest value of relative signal-to-noise ratio of signals obtained when performing a scan with the temporary scan condition; and
   repeating means for repeating adjustment on number of times of addition, y-axis direction resolution, repetition time, and number of data acquisition passes included in the temporary scan condition until a difference between the scan time according to the temporary scan condition and the desired scan time falls within a pre-defined scan time difference range, and a difference between the lowest value of the relative signal-to-noise ratio according to the temporary scan condition and the lowest value of the relative signal-to-noise ratio according to the first scan condition falls within a pre-defined signal-to-noise ratio difference range.

2. The scan condition determining apparatus as recited in claim 1, wherein the first scan condition is a scan condition for obtaining a diffusion-weighted image.

3. The scan condition determining apparatus as recited in claim 2, wherein the third estimating means determines a value of the relative signal-to-noise ratio using the following equation:

$$\text{RELATIVE SIGNAL-TO-NOISE RATIO} = e^{-bD}\sqrt{\frac{NEX}{yres}}$$

where e designates an exponential function, b designates a b-value, D designates a diffusion coefficient, NEX designates a number of times of addition, and yres designates a y-axis direction resolution.

4. The scan condition determining apparatus as recited in claim 2, wherein:
the temporary scan condition is for performing a plurality of scans having corresponding b-values different from one another,
the second estimating means estimates a sum of the scan time for each of the plurality of scans as the scan time according to the temporary scan condition, and
the third estimating means determines a value of the relative signal-to-noise ratio for each of the plurality of scans, and estimates a lowest one of the determined values of the relative signal-to-noise ratio as the lowest value of the relative signal-to-noise ratio according to the temporary scan condition.

5. The scan condition determining apparatus as recited in claim 1, wherein:
the repeating means repeats the processing involving: in the case that the desired scan time is smaller than the scan time according to the first scan condition, decrementing the number of times of addition in a scan corresponding to a b-value resulting in a highest value of the relative signal-to-noise ratio, adjusting the y-axis direction resolution so that the lowest value of the relative signal-to-noise ratio estimated by the third estimating means comes close to that according to the first scan condition, and adjusting the repetition time and number of data acquisition passes so that the scan time is reduced.

6. The scan condition determining apparatus as recited in claim 1, wherein:
the repeating means repeats the processing involving: in the case that the desired scan time is greater than the scan time according to the first scan condition, incrementing the number of times of addition in a scan condition corresponding to a b-value resulting in a lowest value of the relative signal-to-noise ratio, adjusting the y-axis direction resolution so that the lowest value of the relative signal-to-noise ratio estimated by the third estimating means comes close to that according to the first scan condition, and adjusting the repetition time and number of data acquisition passes so that the scan time is reduced.

7. A scan condition determining method comprising:
accepting specification of a desired scan time;
estimating, based on a pre-defined first scan condition, a lowest value of relative signal-to-noise ratio of signals obtained when performing a scan with the first scan condition;
estimating, based on a temporary scan condition, a scan time when performing a scan with the temporary scan condition, the temporary scan condition being the first scan condition in its initial state and updated thereafter;
estimating, based on the temporary scan condition, a lowest value of relative signal-to-noise ratio of signals obtained when performing a scan with the temporary scan condition; and
repeating adjustment on number of times of addition, y-axis direction resolution, repetition time, and number of data acquisition passes included in the temporary scan condition until a difference between the scan time according to the temporary scan condition and the desired scan time falls within a pre-defined scan time difference range, and a difference between the lowest value of the relative signal-to-noise ratio according to the temporary scan condition and the lowest value of the relative signal-to-noise ratio according to the first scan condition falls within a pre-defined signal-to-noise ratio difference range.

8. The method as recited in claim 7, wherein the first scan condition is a scan condition for obtaining a diffusion-weighted image.

9. The method as recited in claim 8, wherein a value of the relative signal-to-noise ratio is determined using the following equation:

$$\text{RELATIVE SIGNAL-TO-NOISE RATIO} = e^{-bD}\sqrt{\frac{NEX}{yres}}$$

where e designates an exponential function, b designates a b-value, D designates a diffusion coefficient, NEX designates a number of times of addition, and yres designates a y-axis direction resolution.

10. The method as recited in claim 8, wherein:
the temporary scan condition is for performing a plurality of scans having corresponding b-values different from one another,
determining the scan time according to the temporary scan condition includes estimating a sum of the scan time for each of the plurality of scans as the scan time according to the temporary scan condition, and
determining the lowest value of the relative signal-to-noise ratio according to the temporary scan includes determining a value of the relative signal-to-noise ratio for each of the plurality of scans, and estimates a lowest one of the determined values of the relative signal-to-noise ratio as the lowest value of the relative signal-to-noise ratio according to the temporary scan condition.

11. The method as recited in claim 7, wherein:
the repeating adjustment comprises: in the case that the desired scan time is smaller than the scan time according to the first scan condition, decrementing the number of times of addition in a scan corresponding to a b-value resulting in a highest value of the relative signal-to-noise ratio, adjusting the y-axis direction resolution so that the lowest value of the relative signal-to-noise ratio estimated by the third estimating means comes close to that according to the first scan condition, and adjusting the repetition time and number of data acquisition passes so that the scan time is reduced.

12. The method as recited in claim 7, wherein:
the repeating adjustment comprises: in the case that the desired scan time is greater than the scan time according to the first scan condition, incrementing the number of times of addition in a scan condition corresponding to a b-value resulting in a lowest value of the relative signal-to-noise ratio, adjusting the y-axis direction resolution so that the lowest value of the relative signal-to-noise ratio estimated by the third estimating means comes close to that according to the first scan condition, and adjusting the repetition time and number of data acquisition passes so that the scan time is reduced.

* * * * *